(12) United States Patent
Markowz et al.

(10) Patent No.: US 9,667,071 B2
(45) Date of Patent: May 30, 2017

(54) METHOD FOR PROVIDING CONTROL POWER BY AN ENERGY STORE BY USING TOLERANCES IN THE DETERMINATION OF THE FREQUENCY DEVIATION

(71) Applicants: Georg Markowz, Alzenau (DE); Wolfgang Schweissthal, Mandelbachtal (DE); Carsten Kolligs, Bottrop (DE); Holger Brezski, Fernwald (DE); Wolfgang Deis, Heidelberg (DE); Michael Igel, Saarbruecken (DE); Anna Flemming, Frankfurt (DE); Dennis Gamrad, Voerde (DE); Sebastien Cochet, Oberhausen (DE); Stefan Winternheimer, Saarbruecken (DE)

(72) Inventors: Georg Markowz, Alzenau (DE); Wolfgang Schweissthal, Mandelbachtal (DE); Carsten Kolligs, Bottrop (DE); Holger Brezski, Fernwald (DE); Wolfgang Deis, Heidelberg (DE); Michael Igel, Saarbruecken (DE); Anna Flemming, Frankfurt (DE); Dennis Gamrad, Voerde (DE); Sebastien Cochet, Oberhausen (DE); Stefan Winternheimer, Saarbruecken (DE)

(73) Assignees: Evonik Degussa GmbH, Essen (DE); STEAG Power Saar GmbH, Saarbruecken (DE)

( * ) Notice: Subject to any disclaimer, the term of this patent is extended or adjusted under 35 U.S.C. 154(b) by 57 days.

(21) Appl. No.: 14/357,313

(22) PCT Filed: Oct. 29, 2012

(86) PCT No.: PCT/EP2012/071342
§ 371 (c)(1),
(2) Date: May 9, 2014

(87) PCT Pub. No.: WO2013/068256
PCT Pub. Date: May 16, 2013

(65) Prior Publication Data
US 2014/0327404 A1    Nov. 6, 2014

(30) Foreign Application Priority Data
Nov. 10, 2011    (DE) .................. 10 2011 055 229

(51) Int. Cl.
*H02J 7/00*      (2006.01)
*H02J 7/04*      (2006.01)
(Continued)

(52) U.S. Cl.
CPC ........ *H02J 7/00* (2013.01); *H02J 3/24* (2013.01); *H02J 3/32* (2013.01); *H02J 7/007* (2013.01);
(Continued)

(58) Field of Classification Search
USPC ....... 320/128, 132, 101, 133, 109, 137, 107, 320/116, 118, 136, 160; 324/764.01, 433
See application file for complete search history.

(56) References Cited

U.S. PATENT DOCUMENTS 4,894,764 A    1/1990    Meyer et al.
5,917,251 A    6/1999    Schermann et al.
(Continued)

FOREIGN PATENT DOCUMENTS

DE      42 15 550 A1    11/1993
DE      195 16 838 A1    11/1996
(Continued)

OTHER PUBLICATIONS

U.S. Appl. No. 14/357,273, filed May 9, 2014, Markowz, et al.
(Continued)

*Primary Examiner* — Alexis A Boateng
(74) *Attorney, Agent, or Firm* — Oblon, McClelland, Maier & Neustadt, L.L.P.

(57) ABSTRACT

A method for providing control power for an electricity network in which at least one energy store connected to the electricity network supplies energy to the electricity network as required and/or takes up energy from the electricity network as required, the control power being delivered in dependence on a frequency deviation from a setpoint value of a network frequency, a tolerance with respect to the frequency deviation being used to set a charging state of the energy store at a same time as providing the control power by the energy store. A device for carrying out such a method includes a control system and an energy store, the device being connected or connectable to an electricity network, the control system being connected to the energy store and controlling the control power that is given off and/or taken up by the energy store.

20 Claims, 3 Drawing Sheets

(51) Int. Cl.
| | | |
|---|---|---|
| H02J 3/32 | (2006.01) | |
| H02J 3/24 | (2006.01) | |
| H02K 5/10 | (2006.01) | |
| H05K 5/06 | (2006.01) | |

(52) U.S. Cl.
CPC .............. *H02J 7/0013* (2013.01); *H02K 5/10* (2013.01); *H05K 5/068* (2013.01)

(56) References Cited

U.S. PATENT DOCUMENTS

| | | | |
|---|---|---|---|
| 6,747,370 B2 | 6/2004 | Abe | |
| 7,747,739 B2* | 6/2010 | Bridges | B60L 3/12 307/80 |
| 7,973,534 B2* | 7/2011 | Tatebayashi | H02J 7/0026 320/116 |
| 8,373,312 B2* | 2/2013 | O'Brien | H01L 31/02021 307/140 |
| 8,378,206 B2 | 2/2013 | Schuette et al. | |
| 9,051,526 B2 | 6/2015 | Markowz et al. | |
| 2005/0077881 A1 | 4/2005 | Capp et al. | |
| 2006/0122738 A1 | 6/2006 | Yamada et al. | |
| 2008/0001479 A1 | 1/2008 | Dengel et al. | |
| 2009/0066287 A1* | 3/2009 | Pollack | G06Q 50/00 320/101 |
| 2009/0278406 A1 | 11/2009 | Hoffman | |
| 2010/0033132 A1* | 2/2010 | Nishi | B60K 6/365 320/136 |
| 2010/0072817 A1 | 3/2010 | Hirst | |
| 2010/0090532 A1 | 4/2010 | Shelton et al. | |
| 2010/0156348 A1 | 6/2010 | Kirchner | |
| 2010/0244886 A1* | 9/2010 | Kawahara | G01R 31/361 324/764.01 |
| 2010/0256970 A1 | 10/2010 | Heese et al. | |
| 2010/0274697 A1* | 10/2010 | Zyren | G06Q 30/04 705/34 |
| 2010/0289451 A1* | 11/2010 | Tuffner | H02J 7/34 320/109 |
| 2010/0327800 A1 | 12/2010 | Reineccius | |
| 2011/0118891 A1 | 5/2011 | Hirst | |
| 2011/0190958 A1 | 8/2011 | Hirst | |
| 2011/0245987 A1* | 10/2011 | Pratt | H01M 10/44 700/295 |
| 2011/0278853 A1 | 11/2011 | Capp et al. | |
| 2011/0309871 A1 | 12/2011 | Miyahara | |
| 2012/0099618 A1 | 4/2012 | Nishi et al. | |
| 2012/0105068 A1 | 5/2012 | Wang et al. | |
| 2012/0139247 A1 | 6/2012 | Krueger | |
| 2012/0161704 A1 | 6/2012 | Gaul et al. | |
| 2012/0169124 A1 | 7/2012 | Nakashima et al. | |
| 2012/0256487 A1 | 10/2012 | Yamada et al. | |
| 2013/0071602 A1 | 3/2013 | Eilbracht et al. | |
| 2013/0108662 A1 | 5/2013 | Brock et al. | |
| 2013/0207591 A1 | 8/2013 | Reineccius | |
| 2014/0039223 A1 | 2/2014 | Klasovsky et al. | |
| 2014/0210267 A1 | 7/2014 | Ishida et al. | |
| 2015/0218475 A1 | 8/2015 | Strese et al. | |
| 2015/0236511 A1 | 8/2015 | Strese et al. | |

FOREIGN PATENT DOCUMENTS

| | | |
|---|---|---|
| DE | 196 00 289 A1 | 7/1997 |
| DE | 10 2008 024 222 A1 | 2/2009 |
| DE | 10 2009 037 239 A1 | 2/2011 |
| DE | 10 2009 050 042 A1 | 2/2011 |
| EP | 0 822 332 A1 | 2/1998 |
| EP | 2 139 090 A1 | 12/2009 |
| EP | 2 200 149 A2 | 6/2010 |
| EP | 2 273 648 A2 | 1/2011 |
| EP | 2 273 648 A3 | 1/2011 |
| GB | 2 426 878 A | 12/2006 |
| JP | 9-65588 A | 3/1997 |
| JP | 2008-178215 A | 7/2008 |
| WO | WO 2004/005685 A1 | 1/2004 |
| WO | WO 2005/029667 A2 | 3/2005 |
| WO | WO 2005/029667 A3 | 3/2005 |
| WO | WO 2006/072576 A1 | 7/2006 |
| WO | WO 2007/104167 A1 | 9/2007 |
| WO | WO 2009/022198 A2 | 2/2009 |
| WO | WO 2010/042190 A2 | 4/2010 |
| WO | WO 2011/060902 A1 | 5/2011 |

OTHER PUBLICATIONS

U.S. Appl. No. 14/357,280, filed May 9, 2014, Markowz, et al.
U.S. Appl. No. 14/357,263, filed May 9, 2014, Markowz, et al.
U.S. Appl. No. 14/357,297, filed May 9, 2014, Markowz, et al.
U.S. Appl. No. 14/357,268, filed May 9, 2014, Markowz, et al.
U.S. Appl. No. 14/357,289, filed May 9, 2014, Markowz, et al.
U.S. Appl. No. 14/357,370, filed May 9, 2014, Markowz, et al.
U.S. Appl. No. 14/357,401, filed May 9, 2014, Markowz, et al.
U.S. Appl. No. 14/357,322, filed May 9, 2014, Markowz, et al.
International Search Report issued Apr. 4, 2013 in PCT/EP2012/071342.
Alexandre Oudalov, et al., "Optimizing a Battery Energy Storage System for Primary Frequency Control", IEEE Transactions on Power Systems, vol. 22, No. 3, Aug. 2007, pp. 1259-1266.
U.S. Appl. No. 14/648,036, filed May 28, 2015, Markowz, et al.
U.S. Appl. No. 14/647,970, filed May 28, 2015, Markowz, et al.
U.S. Appl. No. 14/654,367, filed Jun. 19, 2015, Markowz, et al.
International Search Report issued Aug. 28, 2013 in PCT/EP2012/071257.
International Search Report issued Apr. 4, 2013 in PCT/EP2012/071423.
International Search Report issued Apr. 4, 2013 in PCT/EP2012/071370.
International Search Report issued Sep. 6, 2013 in PCT/EP2012/071250.
International Search Report issued Sep. 13, 2013 in PCT/EP2012/071338.
International Search Report issued Aug. 28, 2013 in PCT/EP2012/071223.
Dr. —Ing. Martin Kleimaier, "Energiespeicher in Stromversorgungssystemen- Bedarf, Technologievergleich und Entwicklungsstand" (Ergebnisse einer ETG-Studie), VDE-Symposium 2009, XP002705594, Nov. 2009, 1-53 Pages http://www.vde.com/de/Regionalorganisation/Berzirksvereine/Thueringen/Berichte__Info/Berichte/documents/energiespeicherinstromversorgungssystemen.pdf.
"TransmissionCode 2003 Anhang D1" Verband der Netzbetreiber —VDN —e.V. beim VDEW, XP002705595, Aug. 2003, 8 pages. https://www.regelleistung.net/ext/static/prequalification.

(56) References Cited

OTHER PUBLICATIONS

"TransmissionCode 2007 Anhang D2 Teil 1" Forum Netztechnik/ Netzbetrieb im VDE (FNN), XP002705596, Nov. 2009, 30 Pages.
"TransmissionCode 2007 Anhang D2 Teil 2" Forum Netztechnik/ Netzbetrieb im VDE (FNN), XP002705597, Nov. 2009, 24 Pages.
Angel Molina-Garcia, et al., "Decentralized Demand-Side Contribution to Primary Frequency Control" IEEE Transactions on Power Systems, vol. 26, No. 1, Feb. 2011, pp. 411-419.
Motoki Tokudome, et al., "Frequency and Voltage Control of Small Power Systems by Decentralized Controllable Loads" PEDS2009, 2009, pp. 666-671.
"Operation Handbook" Union for the co-ordination of transmission of electricity (UCTE), http://www.pseoperator.plluploads/kontener/542UCTE_Operation_Handbook.pdf, Jun. 2004, 144 Pages.
"Gleitender Mittelwert", Wikipedia, Retrieved from http://de.wikipedia.org/wiki/Gleitender_Mittelwert Internet Archive Wayback Machine on Oct. 21, 2016 4 pages (with unedited computer generated English language translation).
"Lithium-lonen-Akkumulator" Wikipedia, Retrieved from http://de.wikipedia.org/wiki/Lithium-lonen-Akkumulator Internet Archive Wayback Machine on Oct. 21, 2016, 12 pages (with unedited computer generated English language translation).
Tomás Mezger, "Technische Bewertung der Bereitstellung von Sekundärregelleistung mit Mikro-KWK-Anlagen" Technische Universität München Lehrstuhl für Energiewirtschaft und Anwendungstechnik, Matrikelnummer: 2284778, Mar. 29, 2007, 82 Pages.
M.G. Rabbani, et al., "Application of simultaneous active and reactive power modulation of SMES Unit under unequal α-mode for power system stabilization" IEEE Transactions of Power Systems, vol. 14, No. 2, XP011089421, May 1999, pp. 547-552.

* cited by examiner

METHOD FOR PROVIDING CONTROL POWER BY AN ENERGY STORE BY USING TOLERANCES IN THE DETERMINATION OF THE FREQUENCY DEVIATION

The invention relates to a method for providing control power for an electricity network in which at least one energy store connected to the electricity network supplies energy to the electricity network as required and/or takes up energy from the electricity network as required, the control power being delivered in dependence on a frequency deviation from a setpoint value of a network frequency.

The invention also relates to a device for carrying out such a method.

Electricity networks are used to distribute electricity from usually a number of energy generators in large areas to many users and to supply households and industry with energy. Energy generators, usually in the form of power plants, provide the energy required for this. Electricity generation is generally planned and provided to meet the forecast consumption.

Both when generating and when consuming energy, it is possible however for unplanned fluctuations to occur. These may arise on the energy generator side for example as a result of a power plant or part of the electricity network failing or, for example in the case of renewable energy sources such as wind, the energy generation being greater than forecast. It is also possible with respect to the consuming entities for unexpectedly high or low levels of consumption to occur. The failure of part of the electricity network, for example cutting off some consuming entities from the energy supply, may lead to a sudden reduction in the electricity consumption.

This generally leads to fluctuations in the network frequency in electricity networks due to unplanned and/or short-term deviations of the power generation and/or consumption. In Europe, for example, the desired AC frequency is 50 000 Hz. This frequency is often also referred to as the desired frequency. A reduction in consumption from the planned level leads to an increase in the frequency of power generated as planned by the energy generators; the same applies to an increase in the electricity production as compared with the planned level when consumption is as planned. On the other hand a reduction in the power produced by the energy generators leads to a reduction in the network frequency when consumption is as planned; the same applies to an increase in consumption as compared with the planned level when generation is as planned.

For reasons of network stability, it is necessary to keep these deviations within defined boundaries. For this purpose, depending on the degree and direction of the deviation, positive control power must be specifically provided by connecting additional generators or disconnecting consuming entities or negative control power must be specifically provided by disconnecting generators or connecting consuming entities. There is a general need for cost-effective and efficient provision of these supplies of control power, it being possible for the requirements for the capacities to be maintained and the dynamics of the control power sources or sinks to vary according to the characteristics of the electricity network.

In Europe, for example, there is a code of practice (UCT Handbook), which describes three different categories of control power. In it, the respective requirements for the types of control power are defined. Among the ways in which the types of control power differ are the requirements for the dynamics and the time for which power is to be delivered. They are also used differently with regard to the boundary conditions. Primary control power ('PCP') is to be delivered Europe-wide by all of the sources involved independently of the place of origin of the disturbance, this being substantially in proportion to the frequency deviation at the given time. The absolute maximum power has to be delivered when there are frequency deviations of minus 200 MHz and below (in absolute terms), the absolute minimum power has to be delivered when there are frequency deviations of plus 200 MHz and above. With regard to the dynamics, it is required that, from the non-operative state, the respective maximum power (in terms of the absolute amount) must be provided within 30 seconds. By contrast, secondary control power (SCP) and minutes reserve power (MR) are to be delivered in the balancing periods in which the disturbance has occurred. Their task is to compensate as quickly as possible for the disturbance and ensure that the network frequency is restored as quickly as possible to the desired range, preferably at the latest after 15 minutes. With regard to the dynamics, lower requirements are stipulated for the SCP and MRP (5 minutes and 15 minutes, respectively, before full power is delivered after activation); at the same time, these power outputs must also be provided over longer time periods than primary control power.

In the electricity networks operated until now, a large part of the control power has been provided by conventional power plants, in particular coal-fired and nuclear power plants. This results in two fundamental problems. On the one hand, the conventional power plants providing control power are not operated at full load, and consequently maximum levels of efficiency, but slightly below, in order to be able when required to provide positive control power, possibly over a theoretically unlimited time period. On the other hand, with increasing expansion and increasingly preferred use of renewable energy sources, there are fewer and fewer conventional power plants in operation, which however is often the basic prerequisite for delivering supplies of control power.

For this reason, there are plans under development for increasing use of energy stores to store negative control power and, when required, provide it as positive control power.

The use of hydraulic pumped storage plants for delivering control power is state of the art. In Europe, the various types of control power are delivered by pumped storage plants. However, hydraulic pumped storage plants are also repeatedly cited as currently the most cost-effective technology for storing and retrieving forms of renewable energy, to allow energy supply and demand to be better adapted to one another in terms of time. The potential for the expansion of storage capacities is a controversial subject of discussion—in particular in Norway—since use requires considerable capacities in power lines to be approved and installed. Consequently, use for energy load management is in competition with the provision of control power.

Against this background, in the area of primary control power many plans for also using other storage technologies, such as for example flywheel mass and battery stores, for the provision of control power have recently been investigated and described.

US 2006/122738 A1 discloses an energy management system which comprises an energy generator and an energy store, the energy store being able to be charged by the energy generator. This is intended to enable an energy generator that does not ensure uniform energy generation in normal operation, such as for example the increasingly favoured renewable energy sources such as wind-power or photovoltaic power plants, to deliver their energy more uniformly into the electricity network. A disadvantage of this is that, although a single power plant can be stabilized in this way, all other disturbances and fluctuations of the electricity network cannot be counterbalanced, or only to a very limited extent.

It is known from WO 2010 042 190 A2 and JP 2008 178 215 A to use energy stores for providing positive and negative control power. If the network frequency leaves a range around the desired network frequency, either energy is provided from the energy store or energy is taken up in the energy store, in order to control the network frequency. DE 10 2008 046 747 A1 also proposes operating an energy store in an island electricity network in such a way that the energy store is used to compensate for consumption peaks and consumption dips. A disadvantage of this is that the energy stores do not have the necessary capacity to compensate for a lengthy disturbance or a number of successive disturbances in the same direction with regard to the frequency deviation.

In the article "Optimizing a Battery Energy Storage System for Primary Frequency Control" by Oudalov et al., in IEEE Transactions on Power Systems, Vol. 22, No. 3 August 2007, the capacity of a rechargeable battery is determined in dependence on technical and operational boundary conditions, in order that it can provide primary control power in accordance with the European standards (UCT Handbook). It has been found that, on account of storage and retrieval losses, in the long term repeated charging of the energy store at relatively great time intervals is unavoidable. Nevertheless, in the short term or temporarily, it may happen that the energy store is overloaded. In the article, a (limited) use of resistors is proposed. However, this leads to energy being destroyed, and generally a depreciation of the energy. In spite of this measure, with a full-load running time of 1.6 hours, the energy store is still of a comparatively large size, at least much larger than to conform to the minimum requirements of the UCT Handbook. The comparatively high capacities entail corresponding investment costs and often make the use of stores uneconomical.

The price for the provision of control power is crucially based on how quickly the control power can be provided after a request, that is to say after a frequency deviation outside the tolerance. In the case of PCP and SCP, payment is made just for keeping the energy available on standby. In the case of SCP and MR, the operational price is also paid.

In the area of secondary control power provision, the various requirements for the dynamics of the delivery of power (commissioning and decommissioning) of the sources (or of the pools of sources) are explained below for the example of the European interconnected network of the UCTE.

1. The prequalifiable secondary control power (SC power, SCP or else nominal power for short) results from the change in power (any direction of control) that is activated and measured within 5 minutes.

2. Brief overshooting of a maximum of 10% above the secondary control power setpoint value is admissible. In any event, brief overshooting of up to 5 MW is admissible.

3. In the case of secondary control power pools, a reaction of the pool must be measurable for the transmission network operator after 30 seconds at the latest.

The payments for the provision of secondary control power are made up of a system charge for keeping the secondary control power on standby and a supply charge for the energy actually delivered in the course of the provision of secondary control power.

Such provisions, in particular concerning groups of energy generators, can be seen in the forum of network technology/network operation of the VDE (FNN) "TransmissionCode 2007", of November 2009. Relevant in this respect in particular is Appendix D2 for the requirements of SCP pools, in which it is also described by which methods a master control technique can be operated by a supplier of SCP.

When using power plants or consuming entities, such as electrolysis works, for the provision of control power, there is the problem that they cannot be run up quickly enough to provide for MR or for SCP in case of need at the speed required.

Rechargeable batteries and other energy stores can take up or deliver energy very quickly, as a result of which they are in principle suitable for providing PCP. However, a disadvantage of this is that very large capacities of the rechargeable batteries have to be provided in order to be able to supply the power even over a lengthy time period or repeatedly. However, rechargeable batteries with a very great capacity are also very expensive.

On account of the losses during storage and retrieval of energy, a draining of the energy store, such as for example a rechargeable battery, takes place sooner or later when there is a statistically symmetric deviation of the network frequencies from the setpoint value through operation. It is therefore necessary to specifically charge the energy store more or less regularly. This charging current must possibly be paid for separately.

U.S. Pat. No. 7,839,027 B2 discloses a method of the generic type for providing control power by an energy store. In this method, the energy store is charged or discharged in the times in which no control power is required in order to achieve a desired initial state of charge. A disadvantage of this is that the power must be drawn from the network, that is to say must be paid for. It is also disadvantageous that, if many control cycles follow one another, the energy store is still always strongly charged or discharged. Therefore, a large capacity (energy storage capacity) of the energy store must still always be provided.

Consistent adherence to the guidelines for the prequalification of primary control technologies requires the provision of corresponding power reserves at every desired operating time, and consequently every desired charging state of the energy store. This requirement (in Germany at present: the marketed primary control power over a period of 15 minutes) has the effect that a corresponding capacity has to be provided, resulting in increased investment costs. In fact, such a reserve would (on a statistical basis) only be used very rarely.

It has been found in the course of developing the invention that sometimes considerable amounts of energy are fed in or out monotonously, as shown by an analysis of actual variations in frequency conducted by the inventors. With a given storage capacity, this leads to a correspondingly great change in the charging state. Great changes in charging state in turn tend to lead to faster ageing than small changes in charging state. Consequently, either the store reaches the end of its lifetime and must be exchanged earlier, or the capacity has to be increased a priori in order to reduce the relative change in charging state. Both lead to an increase in investment costs.

The object of the invention is therefore to overcome the disadvantages of the prior art. It is intended in particular to find a possible way of improving the cost-effectiveness of the operation of energy stores, such as rechargeable batteries, in particular for the provision of primary control power by avoiding inefficient charging states. It is intended at the same time as far as possible to make the provision of primary control power possible with lower energy storage capacity. Moreover, it would also be advantageous if less loading with an ageing effect could be achieved.

Furthermore, the provision of primary control power while avoiding intermediate charging would also be desirable. It is also intended for control power to be provided with an efficient energy yield of the control power supplier.

It can be seen as a further object of the invention that, in particular when using galvanic elements, such as rechargeable batteries, the capacity of the energy store for providing the required control power is intended to be as small as possible.

The object of the invention is achieved by the tolerance with respect to the frequency deviation being used in order to set the charging state of the energy store at the same time as providing the control power by the energy store.

It may be provided here that the tolerance of the amount of the control power to be delivered as a function of the frequency deviation is used in order to set the charging state of the energy store, preferably at the same time as providing the control power by the energy store.

The tolerance with respect to the amount of the control power provided and the tolerance in the determination of the frequency deviation should be understood according to the invention as meaning that, on account of technical boundary conditions, such as the measuring accuracy when determining the control power delivered or the network frequency, certain deviations between an ideal desired power and the control power actually delivered are accepted by the network operator. The tolerance may be granted by the network operator, but could also correspond to a legal provision.

The advantage of these procedures can be seen as being that they succeed in controlling the charging state (state of charge) of the energy store also during the delivery of the control power, and consequently also continuously. The terms state of charge and charging state are to be regarded according to the invention as equivalent.

LESRs (Limited Energy Storage Resources) come into consideration in particular as energy stores.

It may also be provided that the frequency deviation from the setpoint value of the network frequency is determined and the need for positive and/or negative control power is determined from the frequency deviation.

In the case of direct determination of the network frequency or the frequency deviation, own measuring apparatuses can be used. This provides the possibility of determining the frequency deviation with a greater accuracy than is prescribed by the network operator. As a result, a greater frequency tolerance can be used to control the charging state of the energy store.

A particularly preferred embodiment of the invention provides that the frequency deviation is measured with a greater accuracy than is necessary for delivering the control power, preferably with an accuracy of at least ±8 MHz, particularly preferably of at least ±4 MHz, most particularly preferably of at least ±2 MHz, especially preferably of at least ±1 MHz.

The greater the accuracy can be carried out when determining the frequency deviation of the network frequency from the setpoint value, the greater the latitude that can be used to adapt the charging state of the energy store.

A further particularly advantageous refinement of the method according to the invention is obtained if it is provided that the amount of the requested control power is exceeded, preferably by a maximum of 30% and/or by 10 MW, particularly preferably by a maximum of 20% and/or by 5 MW, to make use of the tolerance with respect to the amount of the control power provided, the percentage by which the amount of the requested control power is exceeded being chosen in particular in proportion to the deviation of the charging state of the energy store from a desired medium charging state.

This is so because, when providing control power, it is more suitable to exceed requirements than to have a shortfall, which could lead to problems in the electricity network. Therefore, the network operator can allow a greater tolerance when the control power is exceeded than when there is a shortfall.

According to a further configuration of the invention, it may be provided that the amount of the control power provided is measured with a greater accuracy than is necessary for delivering the control power, preferably with an accuracy of at least ±10 kW, particularly preferably of at least ±1 kW, most particularly preferably of at least ±100 W, especially preferably 10 W, in particular with an accuracy of 1%, preferably 0.1%, of the prequalified power.

An increase in the measuring accuracy also leads to a greater tolerance with respect to the control power that can be used for setting the charging state of the energy store.

According to an especially preferred embodiment of the invention, it may be provided that the charging state of the energy store is set by the energy store feeding into the electricity network a greater control power, lying within the tolerance or the tolerances, or taking up from the electricity network a smaller control power, lying within the tolerance or the tolerances, in the case where the charging state of the energy store lies above a first limit value, and/or the energy store feeding into the electricity network a smaller control power, lying within the tolerance or the tolerances, or taking up from the electricity network a greater control power, lying within the tolerance or the tolerances, in the case where the charging state of the energy store lies below a second limit value.

This provides details of how control of the charging state according to the invention can be achieved. These principles reflect generally applicable reference points of a method according to the invention that achieves the objects on which the invention is based.

It may be provided that the first limit value of the charging state lies between 40% and 80% of the maximum charge of the energy store, preferably between 45% and 70%, particularly preferably between 50% and 60%, and/or the second limit value of the charging state lies between 20% and 60% of the maximum charge, preferably between 30% and 55%, particularly preferably between 40% and 50%, or the first and second limit values of the charging state lie at 50% of the maximum charge of the energy store.

The stated ranges for the limit values of the charging state of the energy store are particularly suitable according to the invention for realizing methods according to the invention. In particular in the case of a great capacity of the energy store, the limit values may also lie at 80% and 20%, respectively, of the maximum charge of the energy store. The figures given in percent relate to the maximum energy content of the energy store.

It may also be provided that the first and/or the second limit value of the charging state can be chosen in dependence on whether positive or negative control power is required, and so, when there is a requirement for positive control power, the first limit value and/or the second limit value of the charging state is chosen for a greater charge of the energy store and, when there is a requirement for negative control power, the first limit value and/or the second limit value of the charging state is chosen for a smaller charge of the energy store, the limit values preferably being chosen as a function of the frequency deviation of the network frequency.

These measures allow the charging state of the energy store to be adapted even better.

According to a further preferred embodiment, it may be provided that a flywheel, a heat store, a hydrogen generator and store with a fuel cell, a natural gas generator with a gas-fired power plant, a pumped storage power plant, a compressed-air storage power plant, a superconducting magnetic energy store, a redox-flow element and/or a galvanic element, preferably a rechargeable battery and/or a battery storage power plant, particularly preferably a lithium-ion battery, is used as the energy store.

These energy stores are suitable for implementing methods according to the invention. Best suited, however, are high-speed energy stores, that is to say energy stores that can make the full control power available in a short time. For this reason, rechargeable batteries are particularly preferred. The heat store must be operated together with a device for producing electricity from the stored thermal energy.

It may also be provided that an energy of at least 1 kWh can be stored in the energy store, preferably of at least 10 kWh, particularly preferably at least 50 kWh, most particularly preferably at least 250 kWh.

The capacity of electrochemical energy stores may in this case be at least 40 Ah, preferably approximately 100 Ah. The individual cells of electrochemical energy stores may operate at at least 1 V, preferably at at least 10 V, particularly preferably at at least 100 V.

These capacities or these amounts of energy are particularly suitable for the provision of control power for an electricity network. Smaller capacities or amounts of energy are not sufficient for influencing the network frequency or for providing control power, at least for a sustained period of time. The great capacity in comparison with commercially available small energy stores, such as for example rechargeable batteries of a mobile phone, and the great energy storing ability are suitable for allowing the considerable amounts of energy for the methods according to the invention to be provided, even in the case of large electricity networks.

It may also be provided that, when there is a control power requirement that requires maximum control power, a greater control power is provided than a contracted control power in order to set the charging state of the energy store.

Once again, when providing control power it is more suitable to exceed requirements than to have a shortfall, which could lead to problems in the electricity network. Therefore, the network operator can allow a greater tolerance when the control power is exceeded than when there is a shortfall. This applies in particular to the maximum control power. Contracted power should be understood as meaning the power that is marketed in operation at the given time with respect to the network operator. The maximum contracted power is equal to the prequalified power.

It may also be provided that the charging state of the energy store is set with the aim of obtaining a medium charging state, preferably a charging state between 20% and 80% of the maximum charge of the energy store, particularly preferably between 40% and 60%, most particularly preferably a charging state of 50%, of the maximum charge of the energy store. Here, too, the maximum charge again relates to the maximum amount of energy that can be stored in the energy store.

Since it is not usually known whether the next request for control power will require positive or negative control power, it is appropriate to keep the charging state in a medium range.

A further configuration of the invention provides that the energy store is operated together with at least one energy generator and/or at least one energy consuming entity, which are used for setting the charging state of the energy store.

Energy generators, such as for example power plants, and energy consuming entities, such as for example electrolysis works, can take over sustained control power loads. Moreover, they can also be used to adapt the charging state of the energy store without taking up electricity from the electricity network or giving off electricity into the electricity network.

It may also be provided here according to the invention that a power plant, preferably a coal-fired power plant, a gas-fired power plant or a hydroelectric power plant, is used as the energy generator and/or a works for producing a substance, in particular an electrolysis works or metal works, preferably an aluminium works or steelworks, is used as the energy consuming entity.

Such energy generators and energy consuming entities are well suited for the provision of supplies of control power in the relatively long term. According to the invention, their inertia can be balanced out well by energy stores.

A particularly preferred embodiment of a method according to the invention is realized by the time tolerance also being used in order to adapt the charging state of the energy store, such that, when there is a change of the required control power, the time after the change of the required control power from which changed control power is provided by the energy store is chosen in dependence on the charging state at the given time of the energy store.

The time tolerance in the delivery of control power is therefore based on the fact that most sources of control power are much more inert than energy stores, in particular than rechargeable batteries. Therefore, the suppliers of PCP, SCP and MR are given time to react to a change in the required control power. This time may be used according to the invention to adapt the charging state of the energy store.

It may in this case be provided that, when there is a change of the required control power, positive control power is fed into the electricity network at an early time, preferably immediately, and/or negative control power is removed from the electricity network at a late time, preferably at the latest possible time, if the charging state of the energy store lies above a first limit value and/or, when there is a change of the required control power, negative control power is removed from the electricity network at an early time, preferably immediately, and/or positive control power is fed into the electricity network at a late time, preferably at the latest possible time, if the charging state of the energy store lies below a second limit value.

It may also be provided that the time lies in a time interval between the change of the required control power and a maximum time after the change of the required control power, the time interval depending on the type of control power requested, in particular the time interval being 30 seconds in the case of provision of primary control power, 5 minutes in the case of provision of secondary control power and 15 minutes in the case of provision of minutes reserve power.

A further configuration of the invention using the time tolerance may provide that the charging state of the energy store is adapted by the choice of the time.

Since energy equals power times time, the time tolerance may also be used in order to adapt the charging state of the energy store.

It may also be provided that a control power gradient is chosen in dependence on the charging state of the energy store, the variation over time of the amount of the control power being particularly set and the tolerance of the amount of the control power to be provided over time being used.

It may be provided in this case that, when there is a change of the request for control power, in particular when there is a measured change of the frequency deviation, the dynamic behaviour with which the energy store reacts to the change of the setpoint value is chosen in dependence on the charging state at the given time of the energy store, the chosen dynamic behaviour preferably depending on the type of control power requested, in particular the time in which the full control power is delivered having to be 30 seconds in the case of provision of primary control power, 5 minutes in the case of provision of secondary control power and 15 minutes in the case of provision of minutes reserve power.

A further embodiment of the invention using the dynamic tolerance may provide that the suitable choice of the dynamic behaviour of the energy store is a response to the change of a request for control power and the charging state of the energy store is adapted as a result.

A particularly preferred embodiment of a method according to the invention is obtained if it is provided that a control power gradient is chosen in dependence on the charging state of the energy store, the variation over time of the amount of the control power being particularly set and the tolerance of the amount of the control power to be provided over time being used.

This makes use of the fact that there are tolerances with respect to the rise or fall of the control power to be provided, given for example given by the network operator or by legal provisions. These tolerances may be used according to the invention to adapt the charging state of the energy store. This provides a further improvement in the optimization of the charging state, or this embodiment represents a particularly preferred realization of the method according to the invention. As a result, the size, or the capacity, of the energy store can be reduced further.

It may also be provided particularly preferably that, when there is a change of the frequency deviation by less than a range of insensitivity, in particular by less than 10 MHz, a changed control power can only be delivered to set the charging state of the energy store, in particular the changed control power can only be delivered if the charging state of the energy store is thereby charged or discharged as strongly as possible towards the medium charging state or as little as possible away from the medium charging state.

The change of the frequency deviation relates here to that frequency deviation at which the last control power adaptation took place. This makes use of a further tolerance. This tolerance may be given by the network operator or the legislature or be inherent within the system. The tolerance allows that no adaptation of the control power has to take place when only small changes of the frequency deviation of the network frequency from the desired frequency occur. In order to develop the charging state of the energy store in the desired direction, control power may nevertheless be delivered. This delivery of control power possibly takes place in the way desired, that is to say for example directly in inverse proportion to the frequency deviation. If therefore control power is delivered to adapt the charging state, this would contribute to controlling the network frequency. The adaptation of the charging state therefore always takes place constructively in the sense of controlling the network frequency. A precondition for this is that the frequency deviation can be measured with greater accuracy than the range of insensitivity. The range of insensitivity is a measure of the tolerance of the change of the frequency deviation from which a change of the control power is required or necessary.

The objects of the invention are also achieved by a device for carrying out such a method, the device comprising a control system and an energy store, the device being connected or connectable to an electricity network, the control system being connected to the energy store and controlling the control power that is given off and/or taken up by the energy store.

In the present case, a control system is understood according to the invention as meaning a simple control system. It should be noted here that any closed-loop control comprises an open-loop control, since in closed-loop control an open-loop control takes place in dependence on a difference between an actual value and a setpoint value. The control system is therefore preferably formed as a closed-loop control system, in particular with respect to the charging state. Particularly preferably, the control system is a master control system.

It may be provided in this case that the device comprises a device for measuring a frequency deviation from a setpoint value of the network frequency of the electricity network, a device for measuring the power fed in and taken up and a memory, the control power that is to be delivered and is dependent on the frequency deviation being stored together with the tolerances in the memory and preferably also at least one charging state of the energy store being stored as a target value or as a limit value or else two charging states being stored as limit values, the control system having access to the memory and being designed for controlling the energy that is given off and/or taken up by the energy store in dependence on the frequency deviation and the charging state of the energy store.

Finally, it may also be provided with respect to methods according to the invention that the energy store is a rechargeable battery, preferably a lithium-ion battery, a lead-sulphuric acid battery, a nickel-cadmium battery, a sodium-sulphide battery and/or a Li-ion battery and/or a composite of at least two of these rechargeable batteries.

These rechargeable batteries are particularly suitable for implementing methods according to the invention on account of their quick reaction time.

The rechargeable batteries include, in particular, lead batteries, sodium-nickel chloride batteries, sodium-sulphur batteries, nickel-iron batteries, nickel-cadmium batteries, nickel-metal hydride batteries, nickel-hydrogen batteries, nickel-zinc batteries, tin-sulphur-lithium-ion batteries, sodium-ion batteries and potassium-ion batteries.

Of these, rechargeable batteries that have a high efficiency and a high operational and calendar lifetime are preferred. As a particularly preferred embodiment of the invention, lithium-polymer batteries, lithium-titanate batteries, lithium-manganese batteries, lithium-iron-phosphate batteries, lithium-iron-manganese-phosphate batteries, lithium-iron-yttrium-phosphate batteries, lithium-air-batteries, lithium-sulphur batteries and/or tin-sulphur-lithium-ion batteries are used as lithium-ion batteries.

The control energy or control power is given off to the electricity network (positive control energy or positive control power) or is taken up from the electricity network (negative control energy or negative control power).

All of the control cycles mentioned can according to the invention and particularly preferably also be carried out one after the other as often as desired, in that the energy store is repeatedly recharged or discharged during a control cycle in order in a second cycle to again have a suitable medium charging state.

It is also ensured by the method according to the invention that the wishes of the customer, that is to say the network operator, for a predictable and defined control power can be met and that no control oscillations are produced in the electricity network.

The nominal power of the device for providing control power is the power that can be achieved within a certain time. Mention is also made here of the prequalifiable power, since this meets the criteria of the customer, that is to say the network operator.

The invention is based on the surprising finding that energy stores can be operated in such a way that the tolerances given by the network operators are used when delivering control power for keeping the charging state of the energy store in a medium range, and thus keeping the capacity of the energy store within low-cost boundaries. This applies in particular to energy stores that can take up and deliver energy quickly, that is to say with high power gradients, such as for example flywheels and, in particular, rechargeable batteries and battery stores. The reason for the tolerances allowed by the network operators is therefore that the control power is usually provided at present by relatively large power plants, such as for example coal-fired power plants, and relatively large consuming entities, such as for example electrolysis works. These control power suppliers have a comparatively great inertia in taking up and delivering control power, that is to say that their power gradients are small and effects such as overshooting within certain boundaries are unavoidable. Therefore, certain tolerances are allowed when delivering control power. Thus, for example, control power suppliers do not have to supply control power even when there are extremely small deviations, but instead a tolerance in the frequency deviation of the network frequency from which control power has to be made available is allowed. It can in this way be ensured that the provision of control power serves exclusively for stabilizing the network frequency. In particular, a tolerance is allowed in the measurement of the frequency deviation of the network frequency, so that the control power to be delivered can be chosen freely within certain boundaries (within a tolerance). The latter tolerance is used according to the invention to adapt the charging state of the energy store in that more or less energy is stored into the energy store or more or less energy is delivered from the energy store to the electricity network. A further tolerance also arises in the accuracy with which power can be fed into the electricity network or taken up from the electricity network. In this respect, it is usually not so important to the network operator whether the control power required is delivered or whether it is exceeded by a certain amount or there is a slight shortfall.

These tolerances can be used to make available more or less control power, and thus charge or discharge the energy store specifically more strongly or less strongly. As a result, the charging state can be specifically influenced. The invention thus succeeds in keeping the charging state in a desired range, for example in a medium range, so that the energy store is in a good, or even optimum, initial state for the next or a changed control power request.

The charging state then no longer has to be controlled, or can be controlled with less energy from the electricity network. Moreover, the capacity of the energy store can be chosen to be smaller. Both save costs. In the case of rechargeable batteries as the energy store, the charging state corresponds to the state of charge (SOC) or the energy content (state of energy, SoE).

Among the ways in which battery stores (rechargeable batteries) are distinguished in comparison with conventional technologies for providing primary and/or secondary supplies of control power is that they can change the power delivered much more quickly. However, in most cases it is disadvantageous with battery stores that they have a comparatively small storage capacity, and therefore can only deliver the required supplies of power over a limited period of time. In a statistical evaluation of the frequency deviations over time, it has surprisingly been found in the course of developing the present invention that, in over 75% of the active time (that is to say power other than zero is delivered), the required supplies of power amount to less than 20% of the maximum power or the marketed power.

It likewise follows from this finding according to the invention that the capacity of the energy store, and consequently the stored amount of control power to be kept available, can be chosen to be smaller, and keeping the capacity of the energy store small can be achieved particularly successfully by a method according to the invention.

The invention makes use here of the fact that it is possible with modern measuring devices and measuring methods to determine the frequency deviation more accurately than is required at present for delivering control power. This makes it possible for the control power that is to be delivered to be chosen freely within the prescribed tolerances (that is to say within the prescribed limits) and, as a result, for the method to be realized.

Special and particularly preferred embodiments of the ways of achieving the objects are that the energy store is a rechargeable battery or a battery store that is used for delivering primary control power.

In a further special embodiment, the energy taken up into the store in the case of negative PC or SC power can be sold on the spot market, in particular when the conditions there are advantageous.

According to a further embodiment, it may be provided within the provisions for delivering control power that in particular more energy is taken up from the network by the energy store than is fed in. This may take place because, according to the regulations including the previously set out procedure, preferably a very large amount of negative control power is provided, whereas, according to the regulations including the previously set out procedure, preferably only the minimum assured amount of positive control power is delivered. Preferably, on average at least 0.1% more energy is taken from the network than is fed in, in particular at least 0.2%, preferably at least 0.5%, particularly preferably at least 1.0%, especially preferably 5%, these values being referred to an average that is measured over a time period of at least 15 minutes, preferably at least 4 hours, particularly preferably at least 24 hours and especially preferably at least 7 days, and relates to the energy fed in.

This may involve using the previously set out delivery of control power in order to take a maximum of energy from the network, the maximum possible negative control power being provided while only a minimum of positive control power is delivered.

In the embodiments of the preferred, and especially maximum, energy take-up, the supplies of energy thereby taken from the network can be sold through the previously described energy trade, this preferably taking place at times at which a price that is as high as possible can be achieved.

Forecasts of the price development that are based on historical data may be used for this purpose.

Furthermore, the charging state of the energy store at the time of a planned sale of energy may be preferably at least 70%, particularly preferably at least 80% and particularly preferably at least 90% of the storage capacity, the charging state after the sale preferably being at most 80%, in particular at most 70% and particularly preferably at most 60% of the storage capacity.

In preferred embodiments of the invention, a number of energy stores are pooled and operated by a procedure according to the invention. The size of the energy stores within the pool may vary. In a particularly preferred embodiment, when using tolerances for the various energy stores of a pool, the change from one parameter setting to another is not performed synchronously but specifically at different times, in order to keep any disturbances in the network as small as possible or at least to a tolerable level.

In a further preferred embodiment, the tolerances used in the various procedures vary according to the time of day, the day of the week or the time of year. For example, in a time period from 5 minutes before to 5 minutes after the change of hour, the tolerances are defined more narrowly. The reason for this is that very often rapid frequency changes take place here. It may be in the interests of the transmission network operators that there are smaller tolerances here, and consequently the provision of control energy takes place more dependably, in the sense of more strictly.

In the following text, exemplary embodiments of the invention are explained on the basis of three schematically depicted figures, without however restricting the invention in the process. In detail:

Figure 1:
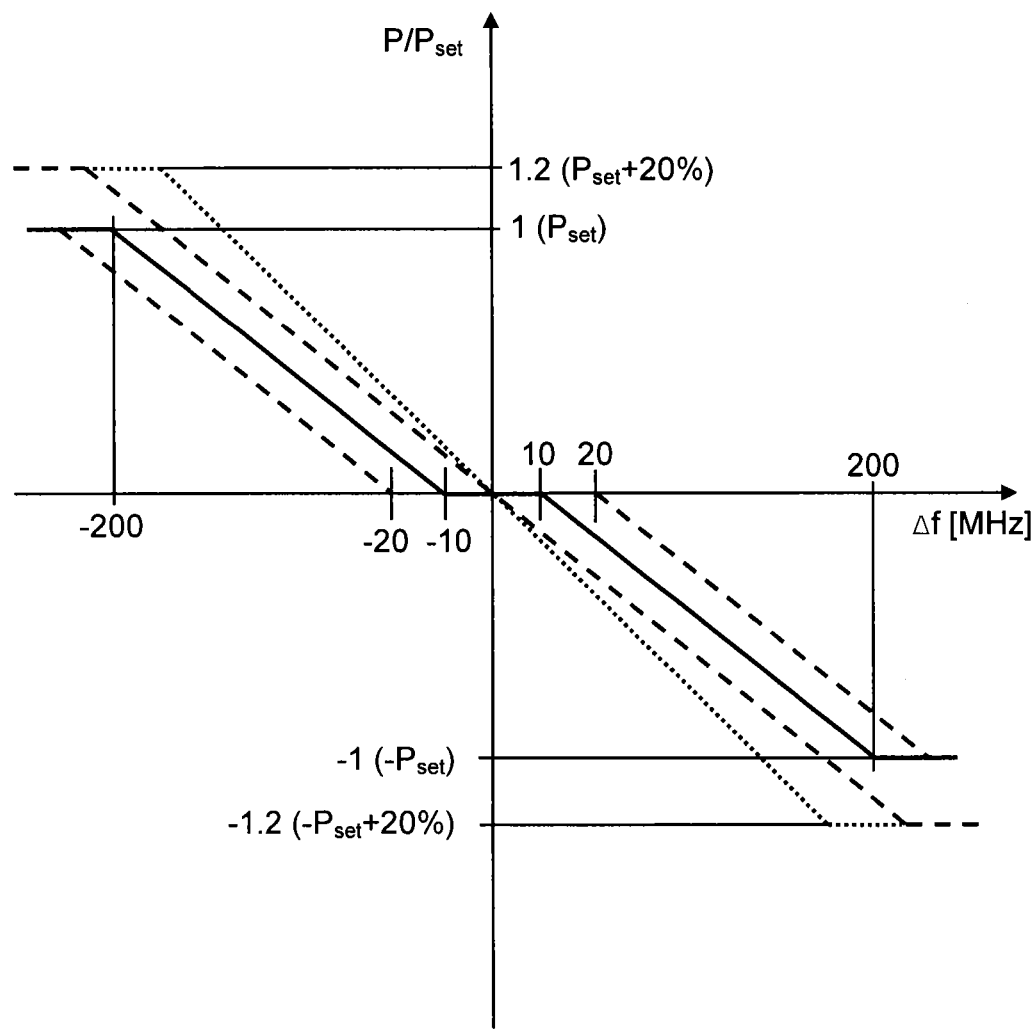
FIG. 1 shows a schematic diagram of the normalized power $P/P_{set}$ against the frequency deviation $\Delta f$ for delivering control power.

FIG. 1 shows a schematic diagram by way of example of the normalized power $P/P_{set}$ against the frequency deviation $\Delta f$ for delivering control power, as required by network operators. In the European electricity network, a network frequency of 50 000 Hz is set; the tolerance in the measurement of the frequency deviation is in this case currently ±10 MHz. The middle, solid curve shows the control power P wanted by the network operator as a dimensionless power $P/P_{set}$ normalized to the prequalified or contracted power $P_{set}$. With a value of 1, the power $P_{set}$ is therefore achieved as positive control power and with a value of −1 the power $−P_{set}$ is achieved as negative control power. In the present case, the power $P_{set}$ is to be provided as from frequency deviations of 200 MHz from the desired network frequency of 50 000 Hz.

To achieve the effect that the provision of control power serves exclusively for stabilizing the network frequency, and counter-productive operation does not occur, no control power is required in a deadband of ±10 MHz around the desired network frequency of 50 000 Hz. The deadband is understood in the present case as a tolerance in the delivery of control power. At the same time, a tolerance and/or a deadband of ±10 MHz is allowed in the measurement of the frequency deviation $\Delta f$.

It may also be the case (other than shown in FIG. 1) that, as from frequency deviations of +10 MHz or −10 MHz, the control power is to be increased abruptly. Then no control power would have to be delivered in the deadband and, as soon as operation is outside the deadband, a control power that is proportional to the frequency deviation would have to be delivered.

The negative and positive control power delivered, and also the control power to be provided as from a frequency deviation of 200 MHz, may also be exceeded by up to 20%, but there must not be any shortfall. This tolerance is represented in the diagram according to FIG. 1 by the dotted line. As a result, the control power P can be delivered in a tolerance around the solid curve, which is bounded by the two dashed curves, or is even bounded by the dashed and dotted curves. The dashed and dotted lines (curves) represent the maximum and minimum control power that can be fed into the electricity network or removed from the electricity network while using these two tolerances in the case of a given frequency deviation.

It should be noted in this respect that under actual conditions it is necessary to maintain a distance from the dashed and/or dotted curves that is limited by the own measuring accuracy. This prevents the control power that is actually provided from lying above or below the tolerance. Therefore, the greater the accuracy of the own measurement of the frequency deviation $\Delta f$, the closer the control power can be delivered to the dashed or dotted lines, and the better use can be made of the tolerance between these curves.

In an extreme case (with frequency measurement of any desired accuracy), therefore, an energy store may be operated along the dashed or dotted lines, in order to keep the charging state of the energy store in a desired medium range. In particular whenever the charging state is already in the medium range or when there is a request for positive control power just above that or when there is a request for negative control power just below that, it may however also be entirely appropriate to operate the energy store along the solid line, in order to provide control power as desired. In the case of a slight deviation, it may also be appropriate to operate in an intermediate region between the solid line and the dashed or dotted lines.

There may also be a time tolerance, that is to say that an actual provision or adaptation of the control power must take place for example only a few seconds after the occurrence of a frequency deviation $\Delta f$ that necessitates feeding in or taking up of control power. According to the invention, and according to a particularly preferred embodiment of a method according to the invention, this time tolerance may also be used to adapt the charging state of the energy store that is used for delivering control power.

If the energy store is relatively highly charged, that is to say the charging state of the energy store is in the upper range, that is to say for example between 75% and 90% of the maximum charge of the energy store, the energy store is operated in the vicinity of the upper right-hand dashed or dotted curve. If a request for positive control power is established by a negative frequency deviation $\Delta f$, positive control power is therefore then provided at a very early time, this control power also tending to be higher than is actually required by the network operator and than is indicated by the solid middle line. This has the effect that the energy store is discharged more strongly than if it were operated according to the solid middle line.

In the case of a request for negative control power that is established by a positive frequency deviation $\Delta f$, the response to the request is by contrast as late as possible, and then also with as little energy take-up as possible in cases of relatively low power levels. This has the effect that the energy store takes up less energy than if it were operated according to the solid middle line. In both cases it is therefore achieved by the method according to the invention that, after a control cycle, the charging state of the energy store is closer to the desired medium charging state than if it were operated as in the conventional way along the solid line.

If the energy store is charged to a relatively little extent, that is to say the charging state of the energy store is in the lower range, that is to say for example between 10% and 25% of the maximum charge of the energy store, the energy store is operated in the vicinity of the lower left-hand dashed or dotted curve. If a request for positive control power is established by a negative frequency deviation $\Delta f$, positive control power is therefore then provided at a very late time, this control power also tending to be lower than is actually required by the network operator and than is indicated by the solid middle line. This has the effect that the energy store is discharged less than if it were operated according to the solid middle line.

In the case of a request for negative control power that is established by a positive frequency deviation $\Delta f$, the response to the request is by contrast as early as possible, and then also with a higher energy take-up in cases of relatively high power levels. This has the effect that the energy store takes up more energy than if it were operated according to the solid middle line. Also in these two cases, it is therefore achieved by the method according to the invention that, after a control cycle, the charging state of the energy store is closer to the desired medium charging state than if it were operated as in the conventional way along the solid line.

By the statistical average, a lower capacity of the energy store has to be kept available when using a method according to the invention than in the case of a conventional method. Since energy stores with greater capacities are more expensive than those with a lower capacity, this allows costs to be saved and fewer resources are used for construction. Alternatively, greater control power can be provided by an energy store of the same dimensions, as long as the power electronics are adapted or are sufficient.

Particularly suitable for methods according to the invention are galvanic elements, in particular rechargeable batteries, most particularly preferably lithium-ion batteries, since they can react very quickly and can therefore make use of the given tolerances particularly well. Slower energy stores, such as for example hydrogen stores and fuel cells or gas-powered plants with natural gas generators and natural gas stores, need a certain time to be able to provide the power. Due to this inertia, the tolerances, in particular the time tolerances, cannot be used as well. Moreover, in comparison with other components, the capacity of these energy stores is not as costly as in the case of rechargeable batteries or flywheels, and so the benefit of using a method according to the invention is also not so great.

Figure 2:
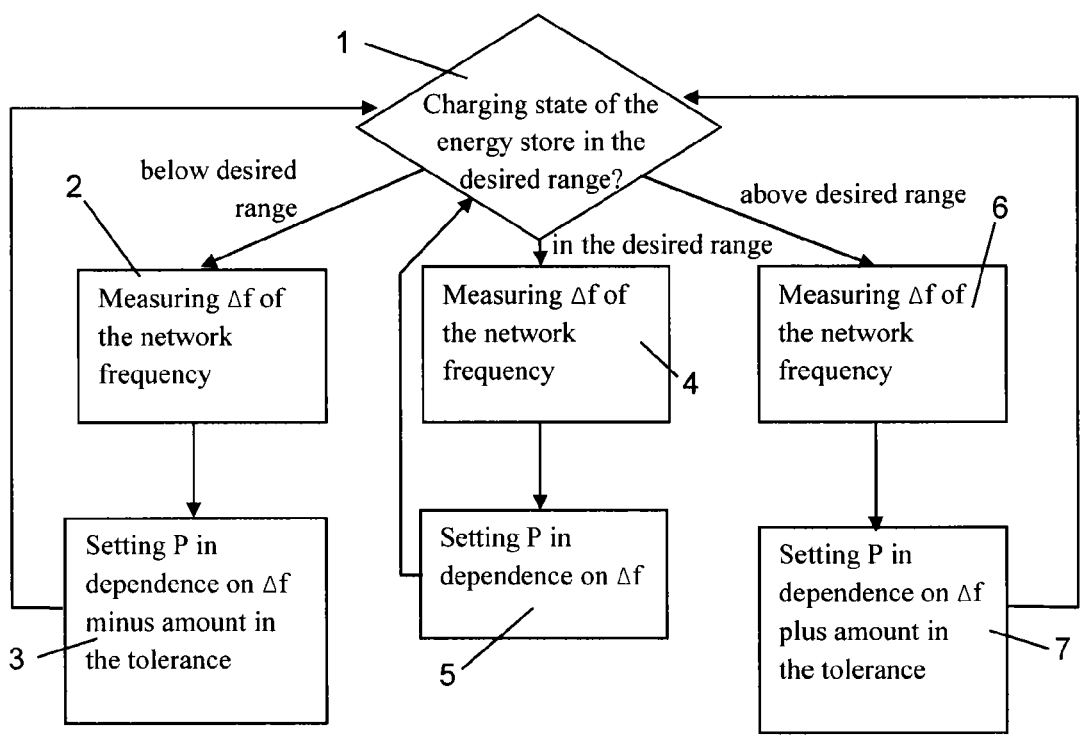
FIG. 2 shows a flow diagram for a method according to the invention.

FIG. 2 shows a flow diagram for a method according to the invention. The method uses an energy store and a control system. In decision step 1, it is checked whether the charging state of the energy store lies within a desired range or whether it lies above or below it.

If the charging state lies within the desired range, the process continues with step 4. If the charging state lies below the desired range or the tolerance, as much energy as possible should be supplied to the energy store, or at least only little further energy drawn, and the process continues with step 2. If the charging state lies above the desired range, energy should as far as possible be drawn from the energy store, or at least only little further energy supplied, and the process continues with step 6.

In steps 2, 4 and 6, it is checked how great the frequency deviation $\Delta f$ of the network frequency of the electricity network is, and the process subsequently continues with steps 3, 5 or 7. If the energy store is in the desired charging state, then in step 5, which follows step 4, the control power P provided from the energy store is set, and thereby made available to the electricity network, in dependence on and as a function of the frequency deviation $\Delta f$ measured in step 4. If the energy store is to be supplied with energy as far as possible, or at least only little further energy is to be drawn, this is achieved in step 3 by the control power P that is provided from the energy store not only being set, and thereby made available to the electricity network, in dependence on and as a function of the frequency deviation $\Delta f$ measured in step 2. Instead, the charging state of the energy store is also taken into consideration in the amount of the control power P provided. Since the charging state lies below the desired range, more energy is supplied to the energy store, or less further energy is drawn.

The tolerances in the delivery of control power that one of the network operators is allowed are used for this purpose. The positive or negative control power provided is therefore always within the limits that are represented in the exemplary embodiment according to FIG. 1. The extent to which this desired range is used may depend here on various factors, for example including the time of day, the time of year, the day of the week, the price at the given time on the electricity market or other likely events. In particular, there may according to the invention also be a functional relationship between the charging state of the energy store and the deviation from the desired control power that is provided or taken up.

Conversely, step 7 is taken if the charging state lies above the desired range, and as far as possible energy is to be drawn from the energy store, or at least only little further energy supplied. This is realized in step 7 in that the control power P provided from the energy store is not only set, and thereby made available to the electricity network, in dependence on and as a function of the frequency deviation $\Delta f$ measured in step 2, but instead also the charging state of the energy store is taken into consideration in the amount of the control power P provided. Since the charging state lies above the desired range, less energy is supplied to the energy store, or additional energy is drawn.

The tolerances in the delivery of control power that one of the network operators is allowed are in turn used for this purpose. In this case too, the positive or negative control power provided is therefore always within the limits that are represented as an example in FIG. 1. The extent to which this desired range is used may depend here in turn on the factors mentioned, such as the time of day, the time of year, the day of the week, the price at the given time on the electricity market or other likely events.

In particular, there may according to the invention also be a functional relationship between the charging state of the energy store and the deviation from the desired control power that is provided or taken up.

A linear relationship between the frequency deviation $\Delta f$ and the control power P to be delivered may be chosen for example as the function P. An additional summand S, in which the other factors, such as the time of day, the time of year, the day of the week, the price at the given time on the electricity market or other likely events, but also in particular the charging state L of the energy store, can be taken into consideration, may be additionally included. For frequency deviations Δf in a range of ±200 MHz, an example of such a functional relationship with respect to FIG. 1 is:

$$P/P_{set}=(\Delta f+S)/200 \text{ MHz or } P/P_{set}=\Delta f/200 \text{ MHz}+S$$

For the first function, S has the dimension of a frequency and ranges between +0.2*Δf+10 MHz and −10 MHz for positive control power and between −0.2*Δf−10 MHz and +10 MHz for negative control power. For the second function, the variable S has no dimension and reflects the tolerance with respect to the amount of the power. The function stored for S must in both cases range within the given limits of the tolerance.

Outside the range ±200 MHz, $P/P_{set}=1$ is chosen, or, as according to FIG. 1, with the tolerance with respect to the maximum control power: $P/P_{set}=1+L1$ 0.2 when there is a request for positive control power or $P/P_{set}=-1-L2$ 0.2 when there is a request for negative control power, the factors L1 and L2 being functions of the charging state L of the energy store and being able to assume values of from 0 to 1. In this case, for example, a middle charging state L=0.5 (50%) may be assigned the value L1=L2=0, or L1=1, if the charging state is at 75% (L=0.75) or above, and L1=0 if the charging state is at 55% (L=0.55) or below. By analogy for L2: L2=1 if the charging state is at 25% (L=0.25) or below and L2=0 if the charging state is at 45% (L=0.45) or above. In between, a linear relationship between L1 or L2 and the charging state L of the energy store may be assumed. For example for the range of the charging state L between 0.55 and 0.75, that is to say 55% to 75%, the function L1=(L−0.55)*5 may be chosen, or, when there is a request for negative control power, and a strongly discharged energy store, for the range of the charging state L between 0.25 and 0.45, that is to say from 25% to 45%, the function L2=(L−0.25)*5 may be chosen. This applies on the assumption that the nominal power $P_{set}$ may be exceeded by up to 20%.

In a way similar to this, the summand S may also be chosen on the basis of the charging state of the energy store or else may depend exclusively on the charging state L of the energy store. The dependence on the charging state L may represent a curve of some kind or other that is within the limits prescribed by the tolerances. A linear relationship may also be used within the limits of the tolerance and within the limits ±200 MHz. It may also be advantageous if the limits of the tolerance are not completely exhausted if the measuring accuracy of the network frequency is not accurate enough. The distance from the limits of the tolerance must correspond at least to the distance equivalent to the degree of uncertainty of the own measurements. Preferably, S is proportional to the deviation of the charging state from a 50% charge (L=0.5).

The present functions are exemplary embodiments of how in step 3, 5 or 7 the charging state of the energy store can be adapted according to the invention.

After steps 3, 5 or 7 the process again continues with the decision step 1, and can in principle also be carried on endlessly.

Figure 3:
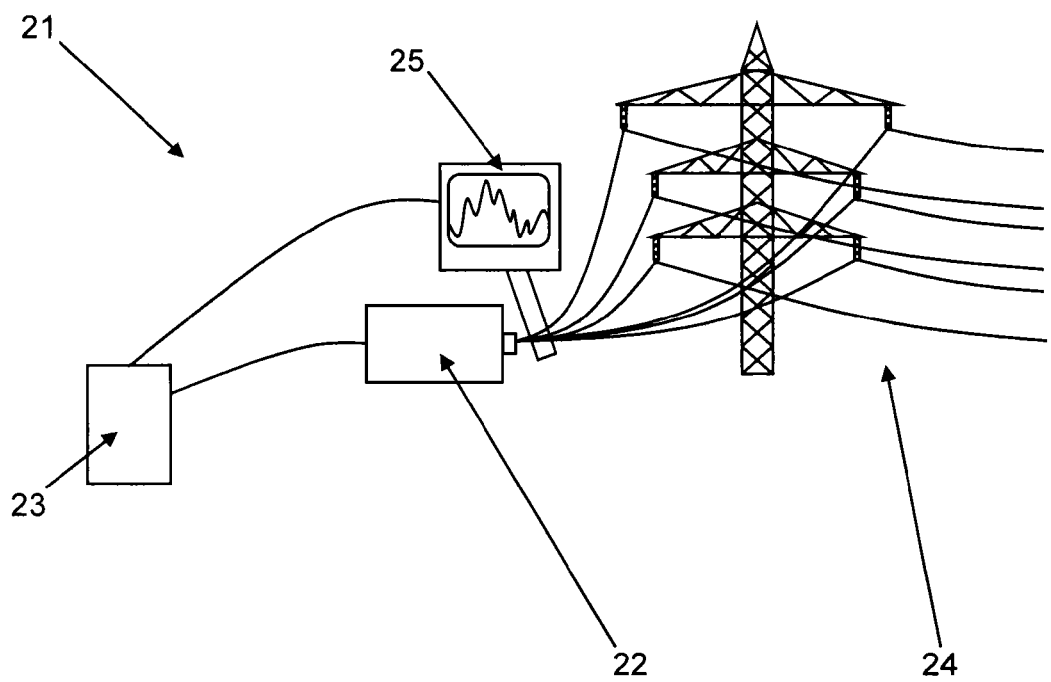
FIG. 3 shows a schematic representation of a device according to the invention for providing control power.

FIG. 3 shows in a schematic view a device 21 according to the invention, comprising an energy store 22. A control system 23 is connected to the energy store 22, so that the control system 23 can set the power take-up and delivery of the energy store 22.

The energy store 22 is connected to an electricity network 24 and can take up power from the electricity network 24 and/or deliver power. The control system 23 is connected to a device 25 for measuring the frequency deviation of the network frequency of the electricity network 24. If there is a need for control power—positive or negative control power—, the control system 23 generates a signal. Subsequently, the control power of the energy store 22 is increased. The device 25 is capable of determining the frequency deviation of the network frequency more accurately than is required. Thus, the tolerance in the determination of the network frequency can be used to set the charging state of the energy store 22.

The charging state of the energy store 22 can be determined by the control system 23 by way of a suitable measuring device, in order to implement a method according to the invention.

The control system 23 may in this case charge or discharge the energy store 22 in an intelligent manner so as to aim for a certain desired charging state. Thus, tolerances in the frequency deviation from which control power is to be delivered, and tolerances in the amount of the control power to be delivered when there is a certain frequency deviation, or tolerances in the determination of the frequency deviation, and tolerances in the maximum prequalified or contracted control power to be delivered can be used to develop the charging state of the energy store 22 in the desired direction. Similarly, the power of the energy store 22 may already be provided in order to charge or discharge the energy store 22 when there is a smaller frequency deviation than a frequency deviation of 10 MHz, if this appears to be necessary. Similarly, an over-provision, for example due to exceeding requirements, of up to 20% beyond the maximum control power may be produced by the energy store 22 in order to control the charging state of the energy store 22.

A particularly quickly reacting and easily chargeable and dischargeable energy store 22 is particularly advantageous in such cases in particular. Rechargeable batteries are best suited for this. Li-ion batteries in particular can be quickly and frequently charged and discharged without any harmful influences on the battery, and so these are particularly suitable and preferred according to the invention for all of the exemplary embodiments. For this, Li-ion batteries with a considerable capacity must be provided. These can for example be easily accommodated in one or more 40 foot ISO containers.

A device 21 according to the invention is therefore particularly well-suited as a primary control power source or else as a secondary control power source.

For details concerning the control of control power and concerning information exchange with the network operators, reference is made to the network technology/network operation forum in the VDE (FNN) "TransmissionCode 2007" of November 2009.

The features of the invention disclosed in the preceding description, and in the claims, figures and exemplary embodiments can, both individually and in any possible combination, be essential for implementing the invention in its various embodiments.

LIST OF REFERENCE SIGNS

P Power
$P_{set}$ Prequalified power (nominal power) or contracted power
f Frequency
Δf Frequency deviation
1 Decision step
2; 3; 4; 5; 6; 7 Method step
21 Device for providing control power
22 Energy store
23 Control system 24 Electricity network
25 Device for determining the frequency deviation

The invention claimed is:
1. A method for providing control power, the method comprising:
delivering the control power based on a frequency deviation from a setpoint value of a network frequency to discharge or change an energy store for supplying energy to an electricity network or taking up energy from the electricity network respectively, a charging state of the energy store being in one of (i) an upper charging state, (ii) a medium charging state, and (iii) a low charging state, amount of the charge in the medium charging state being less than amount of charge in the upper charging state and the amount of charge in the medium charging state being more than amount of charge in the low charging state, wherein
the delivered control power is varied within a tolerance with respect to the frequency deviation to discharge or charge the energy store to move the charging state toward the medium charging state.

2. The method according to claim 1, wherein the tolerance of an amount of the control power to be delivered as a function of the frequency deviation is used to set the charging state of the energy store.

3. The method according to claim 1, wherein the frequency deviation from the setpoint value of the network frequency is determined and a need for positive and/or negative control power is determined from the frequency deviation.

4. The method according to claim 1, wherein
the frequency deviation is measured with a greater accuracy than is necessary for delivering the control power, or with an accuracy of at least ±8 MHz, or at least ±4 MHz, or at least ±2 MHz, or at least ±1 MHz.

5. The method according to claim 1, wherein the charging state of the energy store is set by the energy store feeding into the electricity network a greater control power, lying within the tolerance, or taking up from the electricity network a smaller control power, lying within the tolerance, in a case that the charging state of the energy store lies above a first limit value, and/or the energy store feeding into the electricity network a smaller control power, lying within the tolerance, or taking up from the electricity network a greater control power, lying within the tolerance, in a case that the charging state of the energy store lies below a second limit value.

6. The method according to claim 5, wherein the first limit value of the charging state lies between 40% and 80% of a maximum charge of the energy store, or between 45% and 70%, or between 50% and 60%, and/or the second limit value of the charging state lies between 20% and 60% of the maximum charge, or between 30% and 55%, or between 40% and 50%, or the first and second limit values of the charging state lie at 50% of the maximum charge of the energy store.

7. The method according to claim 5, wherein the first and/or the second limit value of the charging state are chosen in dependence on whether positive or negative control power is required, and, when there is a requirement for positive control power, the first limit value and/or the second limit value of the charging state is chosen for a greater charge of the energy store and, when there is a requirement for negative control power, the first limit value and/or the second limit value of the charging state is chosen for a smaller charge of the energy store, the first and second limit values being chosen as a function of the frequency deviation of the network frequency.

8. The method according to claim 1, wherein a flywheel, a heat store, a hydrogen generator and store with a fuel cell, a natural gas generator with a gas-fired power plant, a pumped storage power plant, a compressed-air storage power plant, a superconducting magnetic energy store, a redox-flow element and/or a galvanic element, a rechargeable battery and/or a battery storage power plant, or a lithium-ion battery, is used as the energy store.

9. The method according to claim 1, wherein an energy of at least 1 kWh can be stored in the energy store, or at least 10 kWh, or at least 50 kWh, or at least 250 kWh.

10. The method according to claim 1, wherein, when there is a control power requirement that requires maximum control power, a greater control power is provided than a contracted control power to set the charging state of the energy store.

11. The method according to claim 1, wherein the charging state of the energy store is set with an aim of obtaining the medium charging state, or a charging state between 20% and 80% of the maximum charge of the energy store, or between 40% and 60%, or a charging state of 50%, of the maximum charge of the energy store.

12. The method according to claim 1, wherein the energy store is operated together with an energy generator and/or an energy consuming entity, which are used for setting the charging state of the energy store.

13. The method according to claim 1, wherein a time tolerance is also used to adapt the charging state of the energy store such that, when there is a change of a required control power, a time after the change of the required control power from which changed control power is provided by the energy store is chosen in dependence on the charging state at a given time of the energy store.

14. The method according to claim 13, wherein, when there is a change of the required control power, positive control power is fed into the electricity network at an early time, or immediately, and/or negative control power is removed from the electricity network at a late time, or at a latest possible time, if the charging state of the energy store lies above a first limit value and/or, when there is a change of the required control power, negative control power is removed from the electricity network at an early time, or immediately, and/or positive control power is fed into the electricity network at a late time, or at a latest possible time, if the charging state of the energy store lies below a second limit value.

15. The method according to claim 1, wherein
a control power gradient is chosen in dependence on the charging state of the energy store, a variation over time of an amount of the control power being set and the tolerance of the amount of the control power to be provided over time being used.

16. The method according to claim 1, wherein,
when there is a change of the frequency deviation by less than a range of insensitivity, or by less than 10 MHz, a changed control power can only be delivered to set the charging state of the energy store, or the changed control power can only be delivered if the charging state of the energy store is thereby charged or discharged as strongly as possible towards the medium charging state or as little as possible away from the medium charging state.

17. A device for carrying out the method according to claim 1, comprising a control system and the energy store, the device being connected or connectable to the electricity network, the control system being connected to the energy store and controlling the control power that is given off and/or taken up by the energy store.

18. A device according to claim 17, wherein the device comprises a device for measuring the frequency deviation from the setpoint value of the network frequency of the electricity network and a memory, the control power that is to be delivered and is dependent on the frequency deviation being stored together with the tolerance in the memory and also at least one charging state of the energy store being stored as a target value or as a limit value or else two charging states being stored as limit values, the control system having access to the memory and configured to control the control power that is given off and/or taken up by the energy store in dependence on the frequency deviation and the charging state of the energy store.

19. A device according to claim 17, wherein the energy store is a rechargeable battery, a lithium-ion battery, a lead-sulphuric acid battery, a nickel-cadmium battery, a sodium-sulphide battery and/or a Li-ion battery, and/or a composite of at least two of these rechargeable batteries.

20. The method according to claim 1, wherein the tolerance of an amount of the control power to be delivered as a function of the frequency deviation is used to set the charging state of the energy store at a same time as providing the control power by the energy store.

\* \* \* \* \*